(12) United States Patent
Chaung et al.

(10) Patent No.: US 8,643,404 B1
(45) Date of Patent: Feb. 4, 2014

(54) SELF-CALIBRATION OF OUTPUT BUFFER DRIVING STRENGTH

(75) Inventors: Yu-Meng Chaung, Taoyuan (TW);
Chun-Hsiung Hung, Hsinchu (TW);
Kuen-Long Chang, Taipei (TW);
Ken-Hui Chen, Hsinchu (TW)

(73) Assignee: Macronix International Co., Ltd.

( * ) Notice: Subject to any disclaimer, the term of this patent is extended or adjusted under 35 U.S.C. 154(b) by 0 days.

(21) Appl. No.: 13/556,579

(22) Filed: Jul. 24, 2012

(51) Int. Cl.
*H03K 3/00* (2006.01)

(52) U.S. Cl.
USPC .............................. 327/108; 327/112; 326/87

(58) Field of Classification Search
USPC ...................................... 327/108, 112; 326/87
See application file for complete search history.

(56) References Cited

U.S. PATENT DOCUMENTS

| | | | | |
|---|---|---|---|---|
| 5,825,219 A | * | 10/1998 | Tsai | 327/112 |
| 5,923,183 A | * | 7/1999 | Kim et al. | 326/27 |
| 6,097,219 A | * | 8/2000 | Urata et al. | 326/83 |
| 6,380,770 B1 | * | 4/2002 | Pasqualini | 327/112 |

* cited by examiner

*Primary Examiner* — Kenneth B. Wells
(74) *Attorney, Agent, or Firm* — Haynes Beffel & Wolfeld LLP

(57) ABSTRACT

An integrated circuit includes an output buffer and a control circuit. The output buffer has a signal input, a signal output, and a set of control inputs. The output buffer has an output buffer delay, and a driving strength adjustable in response to control signals applied to the set of control inputs. The control circuit is connected to the set of control inputs of the output buffer. The control circuit uses first and second timing signals to generate the control signals, and includes a reference delay circuit that generates the first timing signal with a reference delay, and a delay emulation circuit that generates the second timing signal with an emulation delay that correlates with the output buffer delay.

20 Claims, 13 Drawing Sheets

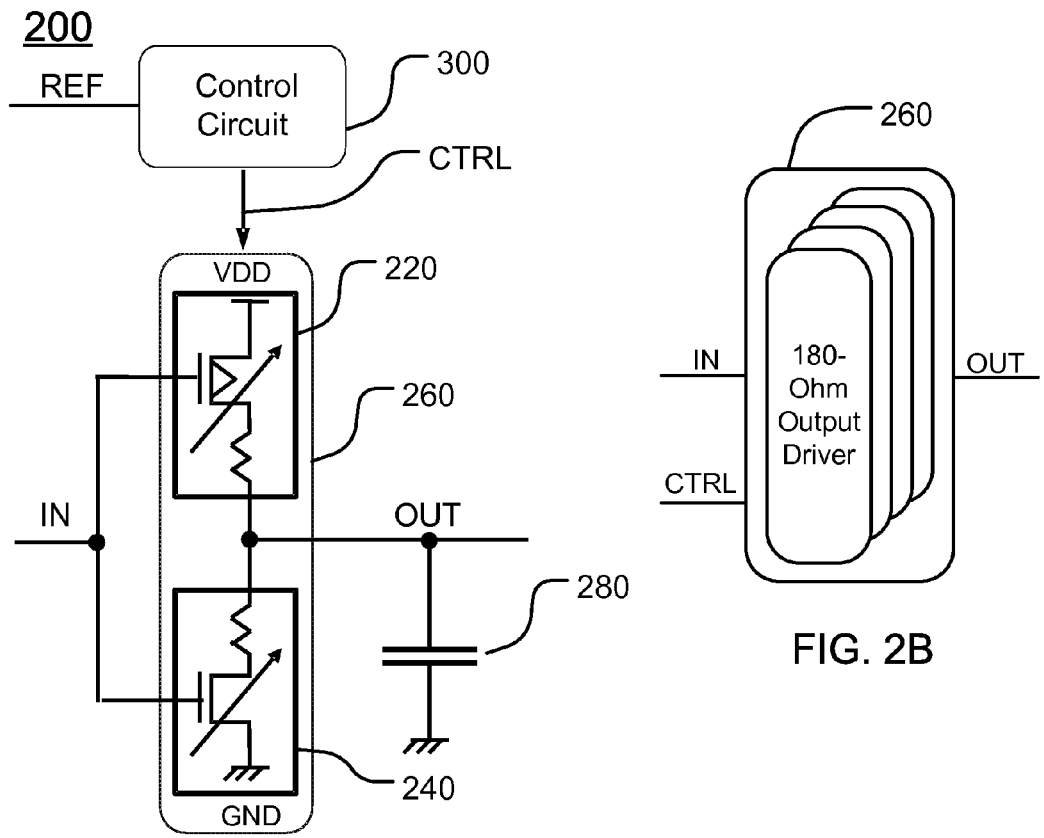
FIG. 2A
FIG. 2B
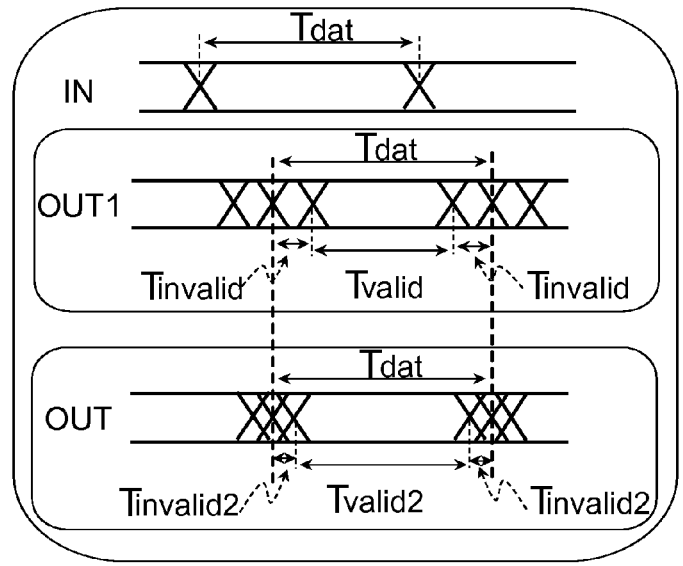
FIG. 2C

| Decoding operation | | | |
|---|---|---|---|
| FY1 | High | High | Low |
| FY2 | Low | High | Low |
| CTRL | No change | Decrease strength | Increase strength |

FIG. 7

SELF-CALIBRATION OF OUTPUT BUFFER DRIVING STRENGTH

BACKGROUND

1. Field of the Invention

The present technology relates to digital circuits and more particularly to output buffers of digital circuits.

2. Description of Related Art

An output buffer in an integrated circuit may be used to receive internal data at low current levels and present it to external loading at higher current levels. The output timing of the output buffer may vary with process corners, voltages, and temperatures (PVT). Variations in output timing due to PVT conditions may reduce the data valid window. The higher the operating speed, the more likely the reduced data valid window may affect the performance and even the reliability of the integrated circuit.

It is desirable to provide an output buffer that is substantially insensitive to PVT conditions and thus provide reliable performance for high speed operations of integrated circuits.

SUMMARY

An integrated circuit includes an output buffer and a control circuit. The output buffer has a signal input, a signal output, and a set of control inputs. The output buffer has an output buffer delay, and a driving strength adjustable in response to control signals applied to the set of control inputs. The control circuit is connected to the set of control inputs of the output buffer. The control circuit uses first and second timing signals to generate the control signals, and includes a reference delay circuit that generates the first timing signal with a reference delay, and a delay emulation circuit that generates the second timing signal with an emulation delay that correlates with the output buffer delay.

Other aspects and advantages of the present technology can be seen on review of the drawings, the detailed description and the claims, which follow.

BRIEF DESCRIPTION OF THE DRAWINGS

FIG. 2A is a block diagram for an example integrated circuit including output buffers with self-calibration of output driving strength.

FIG. 2B illustrates an output buffer with a plurality of output drivers.

FIG. 2C illustrates waveforms associated with the example integrated circuit in FIG. 2A.

FIG. 7 is an example truth table associated with the control circuit illustrated in FIG. 6.

DETAILED DESCRIPTION

A detailed description of implementations of the present technology is provided with reference to the FIGS. 1-13. Preferred implementations are described to illustrate the present technology, not to limit its scope, which is defined by the claims. Those of ordinary skill in the art will recognize a variety of equivalent variations on the description that follows.

Figure 1A:
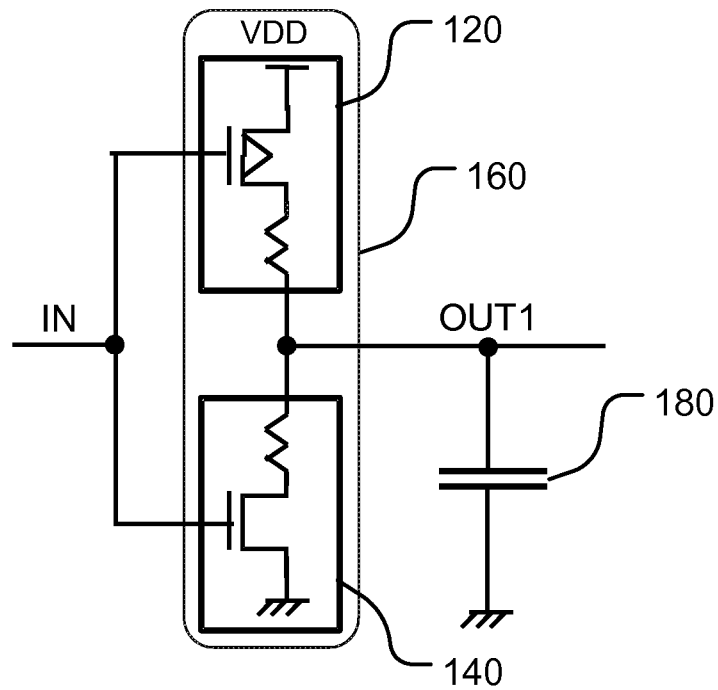
FIG. 1A is an example traditional design of an output buffer.

FIG. 1A is an example traditional design of an output buffer 160. The output buffer 160 includes an NMOS transistor 140 and a PMOS transistor 120 in series. The NMOS transistor 140 has a control terminal, a drain terminal and a source terminal connected to a ground potential. The PMOS transistor 120 has a control terminal, a drain terminal and a source terminal connected to a fixed reference voltage VDD. An input signal IN is coupled to the control terminals of both transistors 120 and 140 in parallel. An output signal OUT1 is coupled to the drain terminals of both transistors 120 and 140. A capacitor 180 represents external loading to the output buffer 160.

Figure 1B:
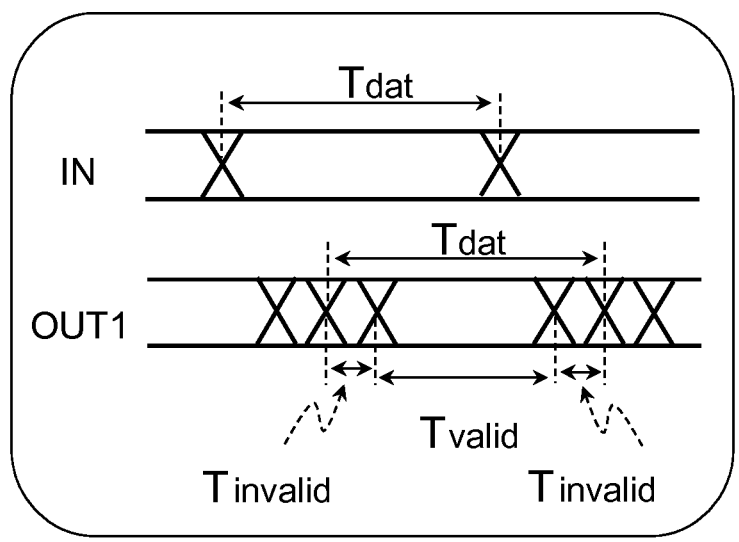
FIG. 1B illustrates waveforms associated with the output buffer in FIG. 1A.

FIG. 1B illustrates waveforms associated with the output buffer 160 in FIG. 1A. Waveforms are shown for the input signal IN, and the output signal OUT1. Tdat is the data valid window of the input signal IN. Under certain PVT conditions, the output buffer 160 may provide the same data valid window Tdat for the output signal OUT1 as the data valid window of the input signal IN. However, under other PVT conditions in which at least one of the process, voltage and temperature conditions is changed, driving strength of the output buffer 160 may decrease/increase, prolong/accelerate rising and falling edges of pulses in the output signal OUT1, and thus reduce the data valid window for the output signal OUT1 from Tdat to Tvalid. Tvalid is narrower than Tdat by the amount of twice Tinvalid because for each pulse, its rising edge is reduced by Tinvalid and its falling edge is also reduced by Tinvalid.

FIG. 2A is a block diagram for an example integrated circuit 200. The example integrated circuit 200 includes an output buffer 260, and a control circuit 300. The output buffer 260 has a signal input, a signal output, and a set of control inputs. The output buffer 260 has an output buffer stage and a driving strength enabling block adjustable in response to control signals CTRL applied to the set of control inputs. An input signal IN is coupled to the signal input of the output buffer 260. An output signal OUT is coupled to the signal output of the output buffer 260. A capacitor 280 is coupled to the signal output of the output buffer 260, representing capacitive loading to the output buffer 260. The control circuit 300 is electrically coupled to a reference signal REF.

Arrows over a first transistor 240 and a second transistor 220 indicate that the driving strength of the output buffer 260 is adjustable. Two resistance symbols connected in series with the first transistor 240 and the second transistor 220 indicate that the output driving strength may be adjusted by using an output resistance method.

The output buffer 260 includes a plurality of output drivers. Each output driver in the output buffer 260 includes a first transistor 240, and a second transistor 220. The first transistor 240 in an output driver has a first conduction terminal electrically coupled to a first fixed reference voltage GND, a second conduction terminal electrically coupled to the output terminal of the output buffer 260, and a control terminal electrically coupled to the input terminal of the output buffer 260. The first transistor 240 has a first channel type, and in one implementation, includes an NMOS (N-channel metal-oxide-semiconductor) transistor.

The second transistor 220 in an output driver has a first conduction terminal electrically coupled to the fixed reference voltage VDD, a second conduction terminal electrically coupled to the output terminal of the output buffer 260, and a control terminal electrically coupled to the input terminal of the output buffer 260. The second transistor has a second channel type opposite the first channel type, and in one implementation, includes a PMOS (P-channel metal-oxide-semiconductor) transistor.

FIG. 2B illustrates an output buffer 260 with a plurality of parallel output drivers. The control signals CTRL enable and disable selected output drivers to adjust the driving strength of the output buffer 260. The input signal IN is provided to the plurality of parallel output drivers. Further description about how the control signals CTRL select output drivers is provided in connection with FIG. 9.

In FIG. 2B, each output driver is a 180-Ohm output driver, and there are four such output drivers connected in parallel for one output buffer 260. In accordance with Ohm's law, the driving strength of the output buffer 260 increases/decreases with lower/higher total resistance of the output buffer 260, respectively. The total resistance of the output buffer 260 is determined by how many output drivers are turned on. In general, the reciprocal of the total resistance of output drivers is the sum of the reciprocal of the resistance of each output driver that is turned on. If the output drivers have equal resistance, then the total resistance of all output drivers is the resistance of one output driver divided by the number of output drivers that are turned on. For example, with a 180-ohm output driver, if 1, 2, 3 or 4 of the output drivers are turned on, then the total resistance of one output buffer 260 is 180-ohm, 90-ohm, 60-ohm, or 45-ohm, respectively. Thus the strongest driving strength of the output buffer 260 corresponds to the total resistance of 45-ohm, while the weakest driving strength of the output buffer 260 corresponds to the total resistance of 180-ohm.

Resolution of adjusting driving strength depends on the number of output drivers in each output buffer 260. Higher number of output drivers corresponds to higher resolution. With four output drivers, the output buffer 260 has four steps in adjusting driving strength. With sixteen output drivers, the output buffer 260 has sixteen steps in adjusting driving strength, assuming equally sized drivers. In other embodiments, the driver sizes can vary, for example including a 1× driver, a 2× driver, a 4× driver and an 8× driver, and decoding circuitry can be used to select a combination of drivers that most effectively adjusts the total driving strength. Also, in other embodiments, the drivers can have strengths that are adjustable using analog control signals.

FIG. 2C illustrates waveforms associated with the output buffer 260 in FIG. 2A. For comparison purposes, waveforms for the input signal IN and the output signal OUT1 in FIG. 1B are duplicated in FIG. 2C. A waveform for the output signal OUT produced by the output buffer 260 is shown with a data valid window Tvalid2. Tvalid2 has been adjusted by the output buffer 260 for PVT conditions. Consequently, Tvalid2 is wider than the reduced data valid window Tvalid of the output signal OUT1 produced by the output buffer 160 (FIG. 1B) without any adjustments for PVT conditions. Tvalid2 is closer to Tdat than Tvalid but may still be narrower than Tdat by the amount of twice Tinvalid2 because for each pulse, its rising edge is reduced by Tinvlid2 and its falling edge is also reduced by Tinvalid2, where Tinvalid2 is less than Tinvalid.

Figure 3:
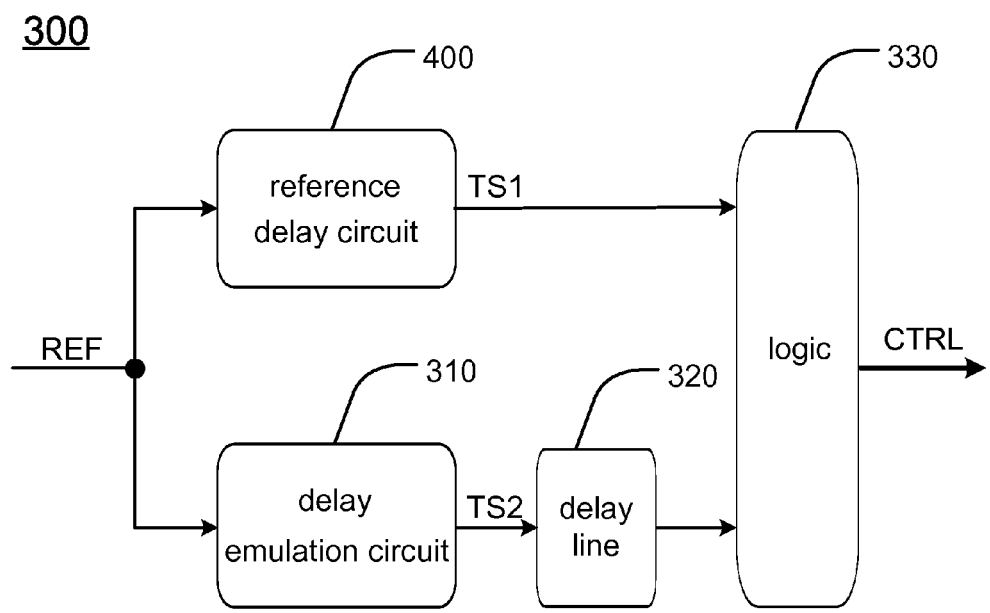
FIG. 3 is a block diagram of a control circuit used in the integrated circuit in FIG. 2A.

FIG. 3 is a block diagram of the control circuit 300 used in the integrated circuit 200 in FIG. 2A. The control circuit 300 is connected to the set of control inputs of the output buffer 260. The control circuit 300 uses first and second timing signals TS1 and TS2 to generate the control signals, and includes a reference delay circuit 400 that generates the first timing signal TS1 with a reference delay, and a delay emulation circuit 310 that generates the second timing signal TS2 with an emulation delay that correlates with the output buffer delay.

The reference delay circuit 400 responds to a reference signal to generate the first timing signal TS1 with the reference delay, and wherein the reference delay circuit 400 is substantially insensitive to process-voltage-temperature (PVT) conditions, or to at least one of the process, voltage and temperature conditions. The delay emulation circuit 310 responds to the reference signal REF on its input to generate the second timing signal TS2 on its output with the emulation delay, and wherein the emulation delay correlates with changes in the output buffer delay resulting from process-voltage-temperature (PVT) conditions, or from at least one of the process, voltage and temperature conditions.

The control circuit 300 also includes a delay line 320 and logic 330. The logic 330 has a first input terminal electrically coupled to the first timing signal TS1, and a second input terminal electrically coupled to the second timing signal TS2 through the delay line 320. The logic 330 compares the arriving time of the first timing signal TS1 from the reference delay circuit 400 and the arriving time of the second timing signal TS2 from the delay emulation circuit 310 to generate the control signals CTRL.

The reference signal REF needs to be similar in electrical characteristics to the input signal IN to the output buffer 260, such that the reference signal REF in combination with the delay emulation circuit 310 can produce timing that correlates to the timing of the output buffer 260. The electrical characteristics may include timing of an active edge and voltage amplitude. The active edge may be a rising edge or a falling edge. The reference signal REF may be generated from a source internal or external to the integrated circuit. The reference signal REF may have a frequency or a range of frequencies suitable for self-calibrating the output driving strength of output buffers in an integrated circuit.

Figure 4:
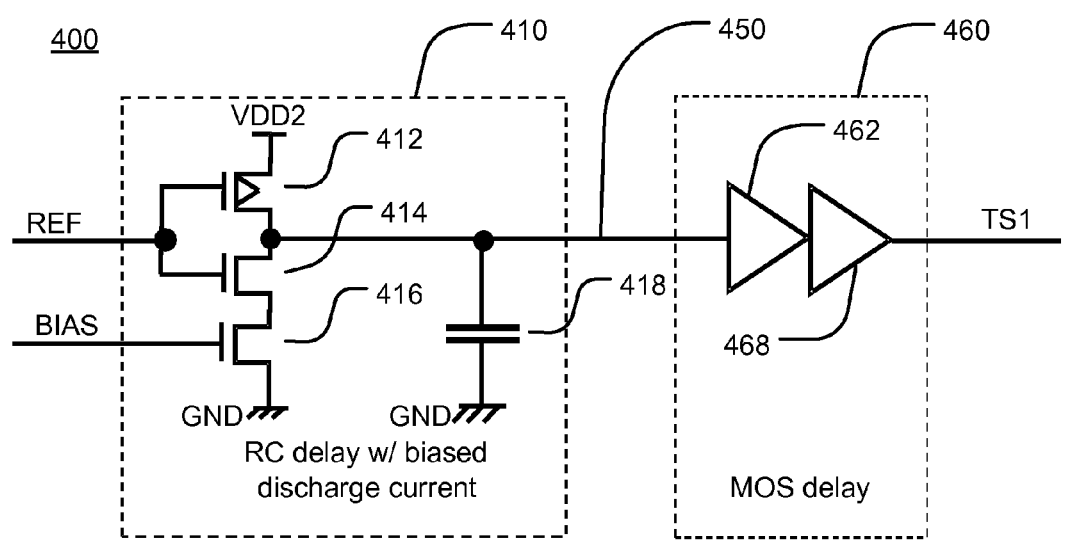
FIG. 4 is a block diagram of a reference delay circuit shown in FIG. 3.

FIG. 4 is a block diagram of the reference delay circuit 400 shown in FIG. 3. The reference delay circuit 400 includes a first delay sub-circuit 410 having an input terminal electrically coupled to the reference signal REF, and having an output terminal. The reference delay circuit 400 also includes a second delay sub-circuit 460 having an input terminal electrically coupled to the output terminal of the first delay sub-circuit 410, and having an output terminal electrically coupled to the first timing signal TS1.

The first delay sub-circuit 410 may include a RC (resistor-capacitor) delay circuit, while the second delay sub-circuit 460 may include a MOS (metal-oxide-semiconductor) delay circuit. Alternatively, the first delay sub-circuit 410 may include a MOS (metal-oxide-semiconductor) delay circuit, while the second delay sub-circuit 460 may include a RC (resistor-capacitor) delay circuit.

The RC delay circuit may include a PMOS transistor 412 and an NMOS transistor 414 connected in series. The PMOS transistor 412 has a control terminal, a drain terminal and a source terminal connected to a second voltage reference VDD2. The NMOS transistor 414 has a control terminal, a drain terminal and a source terminal. The control terminals of the PMOS transistor 412 and the NMOS transistor 414 are coupled in parallel to the input terminal of the first delay sub-circuit 410. The drain terminals of the PMOS transistors 412 and the NMOS transistor 414 are coupled to the output terminal of the first delay sub-circuit 410 and a signal 450. A second NMOS transistor 416 has a control terminal coupled to a bias voltage, a drain terminal coupled to the source terminal of the NMOS transistor 414, and a source terminal connected to a ground potential. The bias voltage may be generated by an analog circuit, and is supplied to make a constant current flow. A capacitor 418 is coupled to the drain terminals of the PMOS transistors 412 and the NMOS transistor 414 via the signal 450.

The MOS delay circuit may include a plurality of delay elements connected in series. The signal 450 is coupled to an input terminal of a first delay element 462 in the plurality of delay elements. An output terminal of a last delay element 468 in the plurality of delay elements is coupled to the output terminal of the second delay sub-circuit 460. As described in reference to FIGS. 5A-5C, the RC delay circuit and the MOS delay circuit compensate each other such that the total delay through the reference delay circuit 400 remains substantially constant under varying PVT conditions.

Figure 5A:
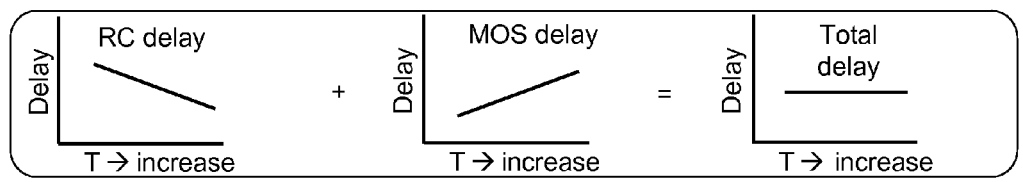
FIGS. 5A-5C include a set of graphs which describe how the reference delay circuit in FIG. 4 compensates for variations in timing due to varying PVT conditions.
Figure 5B:
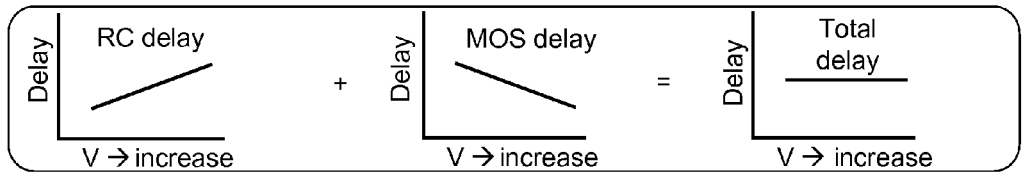
Figure 5C:
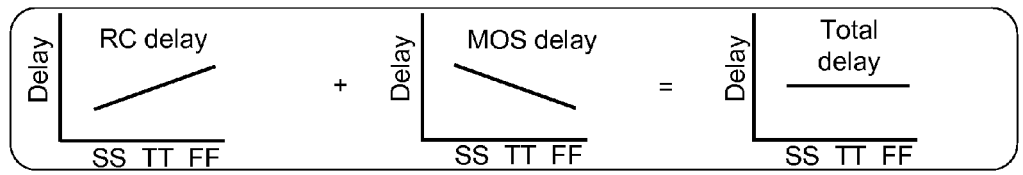

FIGS. 5A-5C include a set of graphs which describe how the reference delay circuit in FIG. 4 compensates for variations in timing due to PVT conditions. Variations in PVT conditions are relative to nominal PVT conditions. Nominal PVT conditions include a nominal voltage, a nominal temperature, and a nominal process corner. A nominal voltage may be specified for an integrated circuit. For example, a nominal voltage may be 3.3V for one integrated circuit but 1.5V for another. A nominal temperature may be 25 degrees Celsius. A nominal process corner may be typical-typical (TT). Process corners are described further in connection with FIG. 5C.

A nominal delay for the delay emulation circuit 310 is the delay across the delay emulation circuit 310 under nominal PVT conditions. In general, the delay across the delay emulation circuit 310 varies with PVT conditions, and is greater than or less than the nominal delay. A total delay for the reference delay circuit 400 preferably remains substantially constant over PVT conditions, as described below for FIGS. 5A-5C. As used in connection with description of the reference delay circuit, a delay is "substantially constant" or the circuit is "substantially insensitive" if the delay across the reference delay circuit 400 drifts over PVT conditions within time range small enough, in comparison to how much delay across a PVT sensitive circuit such as emulation circuit for the output buffer can drift over the same PVT conditions, for the reference delay circuit 400 to serve as a time delay reference for self-calibration of output buffer output driving strength. In practice, a reference delay circuit should provide a reference delay that is comparatively less sensitive to variations in one or more process, voltage and temperature conditions than the emulation circuit for the output buffer being calibrated. A comparatively less sensitive reference delay circuit can improve performance, even if the delay of the reference delay circuit does not remain constant.

FIG. 5A illustrates that as temperature increases, the RC delay across the RC delay circuit decreases, while the MOS delay across the MOS delay circuit increases. The net result of the decreased RC delay and the increased MOS delay due to variations in temperature is that the total delay across the RC delay circuit and the MOS delay circuit is substantially constant, resulting in a circuit substantially insensitive to variations in temperature.

FIG. 5B illustrates that as supply voltage increases, the RC delay across the RC delay circuit increases, while the MOS delay across the MOS delay circuit decreases. The net result of the increased RC delay and the decreased MOS delay due to variations in supply voltage is that the total delay across the RC delay circuit and the MOS delay circuit is substantially constant, resulting in a circuit substantially insensitive to variations in supply voltage.

FIG. 5C illustrates the effects of process corners on the RC delay and the MOS delay. Process corners represent variations in fabrication parameters for integrated circuits. Circuits fabricated at different process corners may operate at faster or slower speeds. One way to name process corners is to represent an N-channel MOS corner with a first letter, and to represent a P-channel MOS corner with a second letter. Typically, letters S, T, and F represent slow, typical and fast corners, respectively. For example, an FF corner is a corner with fast NMOS devices and fast PMOS devices.

FIG. 5C illustrates that the RC delay across the RC delay circuit at Slow-Slow (SS) process corners is less than the RC delay across the RC delay circuit at Fast-Fast (FF) process corners, while the MOS delay across the MOS delay circuit at Slow-Slow (SS) process corners is greater than the RC delay across the RC delay circuit at Fast-Fast (FF) process corners. The net result of the increased RC delay and the decreased MOS delay due to process variations is that the total delay across the RC delay circuit and the MOS delay circuit is substantially constant, resulting in a circuit substantially insensitive to process corners.

The control signals CTRL have a first value if the first timing signal TS1 occurs within a timing window between a first delay threshold and a second delay threshold relative to the second timing signal TS2, a second value if the first timing signal TS1 is earlier than the second timing signal TS2 by more than the first delay threshold, and a third value if the first timing signal TS1 is later than the second timing signal TS2 by more than the second delay threshold.

In one implementation, the first value may indicate that it is not necessary to increase or decrease the driving strength of the output buffer 260. The second value may indicate that it is needed to increase the driving strength, and the third value may indicate that it is needed to decrease the driving strength. The control circuit 300 continuously monitors the PVT conditions and generates the control signals CTRL. The output buffer 260 continuously adjusts its output strength in accordance with values of the control signals CTRL.

Figure 6:
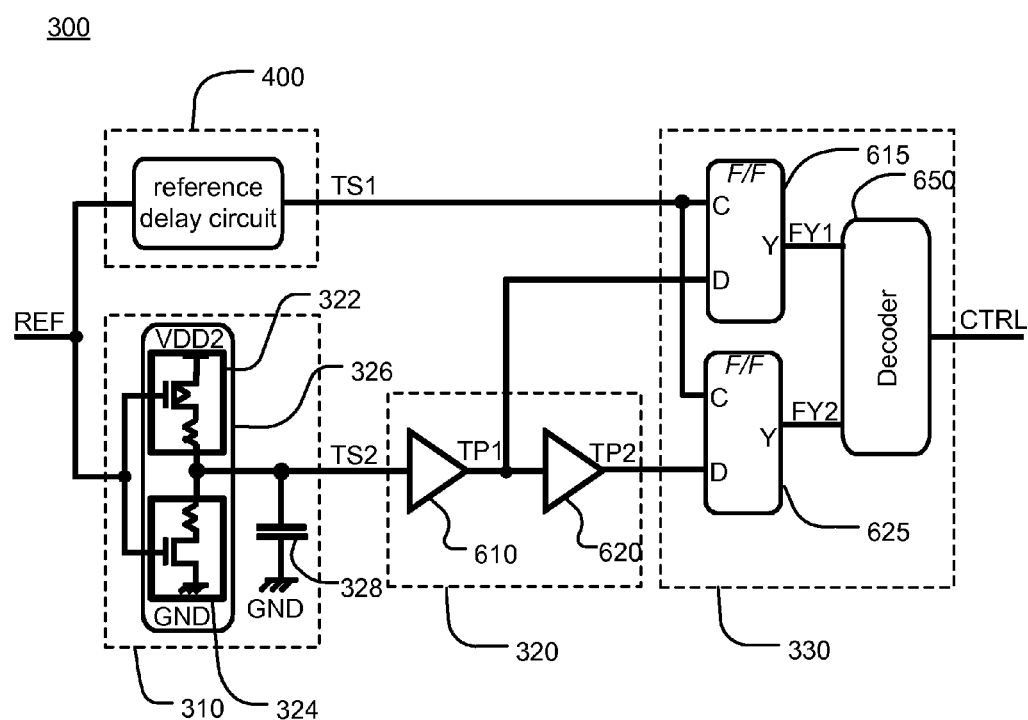
FIG. 6 illustrates the control circuit in FIG. 3 in more detail.

FIG. 6 illustrates the control circuit 300 in FIG. 3 in more details. In addition to the reference 400 and the delay emulation circuit 310, the control circuit 300 includes a delay line 320 and logic 330. The delay line 320 has an input coupled to the delay emulation circuit 310. The delay line 320 has a first tap TP1 corresponding to the first delay threshold, and a second tap TP2 corresponding to the second delay threshold. The logic 330 is coupled to the first tap TP1 and second tap TP2 on the delay line 320, and to the reference delay circuit 400. The logic 330 generates the control signals CTRL.

The delay line 320 includes a first buffer circuit 610, and a second buffer circuit 620. The first buffer circuit 610 has an input terminal electrically coupled to the output terminal of the delay emulation circuit 310 via the second timing signal TS2, and has an output terminal. The second buffer circuit 620 has an input terminal electrically coupled to the output terminal of the first buffer circuit 610 via a first tap TP1, and has an output terminal coupled to a second tap TP2.

The first buffer circuit 610 has a first delay across the first buffer circuit 610. The second buffer circuit 620 has a second delay across the second buffer circuit 620. The first buffer circuit 610 is for signal recovery, sharpening the rising or falling edge of the second timing signal TS2. As such the first delay may be as short as possible. The second delay defines a timing window for the logic 330. The timing window can be measured as the delay between a rising edge of the first tap TP1 and a subsequent rising edge of the second tap TP2, or between respective falling edges. The second buffer circuit 620 may include a series of inverters, such as 8, or 10 inverters. If the inverters have equal delay, then the timing window is doubled if the number of inverters is doubled in the second buffer circuit 620. Description of FIGS. 11-13 explains the timing relationship between the timing window, the first timing signal TS1, and the second timing signal TS2.

The logic 330 in the control circuit 300 includes a first storage circuit 615, a second storage circuit 625, and a decoder 650. The first storage circuit 615 has a clock input terminal C electrically coupled to the reference delay circuit 400 to receive the first timing signal TS1, a data input terminal D electrically coupled to the first tap TP1 of the delay line 320, and having an output terminal. The second storage circuit 625 has a clock input terminal C electrically coupled to the reference delay circuit 400 to receive the first timing signal TS1, a data input terminal D electrically coupled to the second tap TP2 of the delay line 320, and having an output terminal. The decoder 650 is coupled to the outputs of the first storage circuit 615 and second storage circuit 625 to produce the control signals CTRL.

A storage circuit such as the first storage circuit 615 or second storage circuit 625 stores a logic level of a signal coupled to its data input terminal D at a rising edge or a falling edge of a clock signal coupled to its clock input terminal C, and presents the stored logic level at its output terminal Y until the next rising edge or falling edge at its clock input terminal C.

As shown in FIG. 6, a scaled-down circuit 326 of the output buffer 260 inside the delay emulation circuit 310 includes a first scaled-down circuit 324 of the first transistor 240 of the output buffer 260, and a second scaled-down circuit 322 of the second transistor 220 of the output buffer 260.

The first scaled-down circuit 324 has a first conduction terminal electrically coupled to the first fixed reference voltage GND, a second conduction terminal electrically coupled to the output terminal of the delay emulation circuit 310, and a control terminal electrically coupled to the input terminal of the delay emulation circuit 310. The second scaled-down circuit 322 has a first conduction terminal electrically coupled to the second fixed reference voltage VDD2, a second conduction terminal electrically coupled to the output terminal of the delay emulation circuit 310, and a control terminal electrically coupled to the input terminal of the delay emulation circuit 310. For convenience of design, the second fixed reference voltage VDD2 may be the same as the fixed reference voltage VDD for the output buffer 260 (FIG. 2A). Alternatively, the second fixed reference voltage VDD2 may be different than the fixed reference voltage VDD for the output buffer 260, provided that the delay emulation circuit 310 (FIG. 6) can emulate the behavior of the output buffer 260 (FIG. 2A).

As shown in FIG. 6, the first scaled-down circuit 324 and the second scaled-down circuit 322 in the delay emulation circuit 310 include a scaled-down NMOS transistor and a scaled-down PMOS transistor, emulating the first transistor 240 and the second transistor 220 in the output buffer 260, respectively. The reference signal REF is coupled to the input terminal of the delay emulation circuit 310. The second timing signal TS2 is coupled to the output terminal of the delay emulation circuit 310.

The delay emulation circuit 310 also includes a capacitor 328 coupled to the output terminal of the delay emulation circuit 310. The capacitor 328 has a capacitive value scaled down from capacitive loading at the output terminal of the output buffer 260, as represented by the capacitor 280 (FIG. 2A). For instance, in FIG. 2A, the capacitor 280 at the output terminal of the output buffer 260 in FIG. 2A is 30 pF (picofarad) and the output buffer 260 has a resistance of 30 Ohm, resulting in a time constant of 900 ps (picoseconds). Correspondingly, in FIG. 6, the capacitor 328 at the output terminal of the scaled-down circuit 326 may be scaled down to 5 pF and the resistance of the scaled-down circuit 326 may be scaled up to 180 Ohm to emulate the time constant of 900 ps (5 pF times 180 Ohm=900 ps).

FIG. 7 is an example truth table associated with the control circuit 300 illustrated in FIG. 6, illustrating an example decoding operation. When the signals FY1 and FY2 are at logic high and low, respectively, the control signals CTRL indicate that the driving strength of an output buffer 260 does not need to be increased or decreased. When the signals FY1 and FY2 are both at logic high, the control signals CTRL indicate that the driving strength of an output buffer 260 needs to be decreased. When the signals FY1 and FY2 are both at logic low, the control signals CTRL indicate that the driving strength of an output buffer 260 needs to be increased.

The control circuit 300 shown in FIG. 6, and the truth table shown in FIG. 7 illustrate one implementation of the present technology. To those with ordinary skill in the art, variations may be made to the implementation. For example, the first storage circuit 615 and second storage circuit 625 may register data on the falling edge of the clock input C instead of the rising edge. The decoder 650 may have a different decoding scheme, such as a decoding scheme where no change in driving strength is when the FY1 and FY2 signals are at logic low and high, instead of at logic high and low, respectively.

Figure 8:
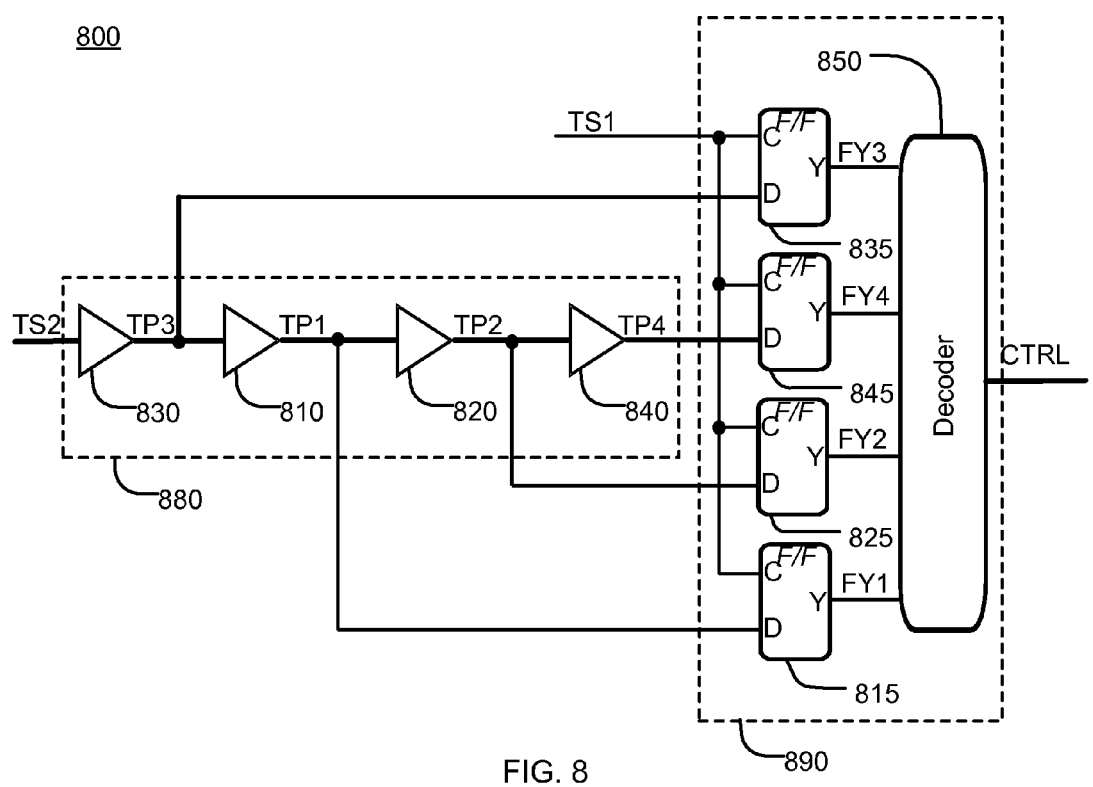
FIG. 8 illustrates an alternative control circuit.

FIG. 8 illustrates an alternative control circuit 800 to the control circuit 300. Description about the delay line 320 and the logic 330 generally applies to the alternative control circuit 800 in FIG. 8. The alternative control circuit 800 includes circuits that indicate a timing window from a plurality of timing windows in which the first timing signal occurs relative to the second timing signal, and logic 890 which generates the control signals CTRL in response to the indicated timing window.

The alternative control circuit 800 includes a delay line 880 and logic 890. The delay line 880 has an input coupled to the delay emulation circuit 310 (FIG. 6) via the second timing signal TS2. The delay line 880 has a plurality of taps, such as TP1, TP2, TP3 and TP4, corresponding to the plurality of timing windows. The logic 890 is coupled to the plurality of taps on the delay line 880, and to the reference delay circuit 400 (FIG. 6) via the first timing signal TS1. The logic 890 generates the control signals CTRL.

The plurality of timing windows and the plurality of taps provide more accurate control in adjusting output driving strengths than a single timing window with two taps, such as shown in FIG. 6. The alternative control circuit 800 illustrates a first buffer circuit 810, a second buffer circuit 820, a first storage circuit 815, a second storage circuit 825, and a decoder 850 corresponding to the first buffer circuit 610, the second buffer circuit 620, the first storage circuit 615, the second storage circuit 625, and the decoder 650 in FIG. 6, respectively. Signals TP1, TP2, FY1, and FY2 in FIG. 8 correspond to the signals TP1, TP2, FY1, and FY2 in FIG. 6, respectively.

In addition, the alternative control circuit 800 includes a third buffer circuit 830, a fourth buffer circuit 840, a third storage circuit 835, and a fourth storage circuit 845. The third buffer circuit 830 has an input terminal electrically coupled to the second timing signal TS2, and has an output terminal electrically coupled to a third tap TP3. The first buffer circuit 810 has an input terminal electrically coupled to the third tap TP3, and has an output terminal electrically coupled to the first tap TP1. The second buffer circuit 820 has an input terminal electrically coupled to the first tap TP1, and has an output terminal electrically coupled to the second tap TP2. The fourth buffer circuit 840 has an input terminal electrically coupled to the second tap TP2, and has an output terminal electrically coupled to the fourth tap TP4.

The third buffer circuit 830 is for signal recovery, sharpening the rising or falling edge of the second timing signal TS2. As such the delay across the third buffer circuit 830 may be as short as possible.

A first timing window in the plurality of timing windows is defined by the delay across the second buffer circuit 820. The first timing window can be measured as the delay between a rising edge of the first tap TP1 and a subsequent rising edge of the second tap TP2, or between a falling edge of the first tap TP1 and a subsequent falling edge of the second tap TP2.

A second timing window in the plurality of timing windows is defined by the delays across the first buffer circuit 810, the second buffer circuit 820, and the third buffer circuit 840. The second timing window can be measured as the delay between a rising edge of the third tap TP3 and a subsequent rising edge of the fourth tap TP4, or between a falling edge of the third tap TP3 and a subsequent falling edge of the fourth tap TP4. For instance, if the first buffer circuit 810, the second buffer circuit 820, and the fourth buffer circuit 840 consist of 4 inverters, 8 inverters and 4 inverters with substantially the same delay each, then the second timing window is twice as wide as the first timing window.

More timing windows can be defined by adding more pairs of buffer circuits in series. With one timing window, the driving strength of the output buffer 260 may be increased or decreased by one step in response to a detection based on the one timing window. With two timing windows, the driving strength of the output buffer 260 may be increased or decreased by two steps in response to detections based on the two timing windows. In general, multiple timing windows facilitate multiple steps and higher accuracy in adjusting output driving strengths of output buffers.

Similar to the control circuit 300, the first storage circuit 815 has a clock input terminal C electrically coupled to the first timing signal TS1, a data input terminal D electrically coupled to the first tap TP1, and has an output terminal. The second storage circuit 825 has a clock input terminal C electrically coupled to the first timing signal TS1, a data input terminal D electrically coupled to the second tap TP2, and has an output terminal.

In addition, in the alternative control circuit 800 shown in FIG. 8, the third storage circuit 835 has a clock input terminal C electrically coupled to the first timing signal TS1, a data input terminal D electrically coupled to the third tap TP3, and has an output terminal electrically coupled to a signal FY3. The fourth storage circuit 845 has a clock input terminal C electrically coupled to the first timing signal TS1, a data input terminal D electrically coupled to the fourth tap TP4, and has an output terminal electrically coupled to a signal FY4.

The logic 890 includes the decoder 850. The decoder 850 is coupled to the output terminals of the first storage circuit 815, the second storage circuit 825, the third storage circuit 835, and the fourth storage circuit 845 to produce the control signals CTRL. The decoder 850 generates the control signals CTRL by decoding the signals provided by the output terminals of the four storage circuits. The control signals CTRL may indicate at least three cases: to make no change to, to increase, or to decrease the output driving strength of one or more output buffers 260.

Figure 9:
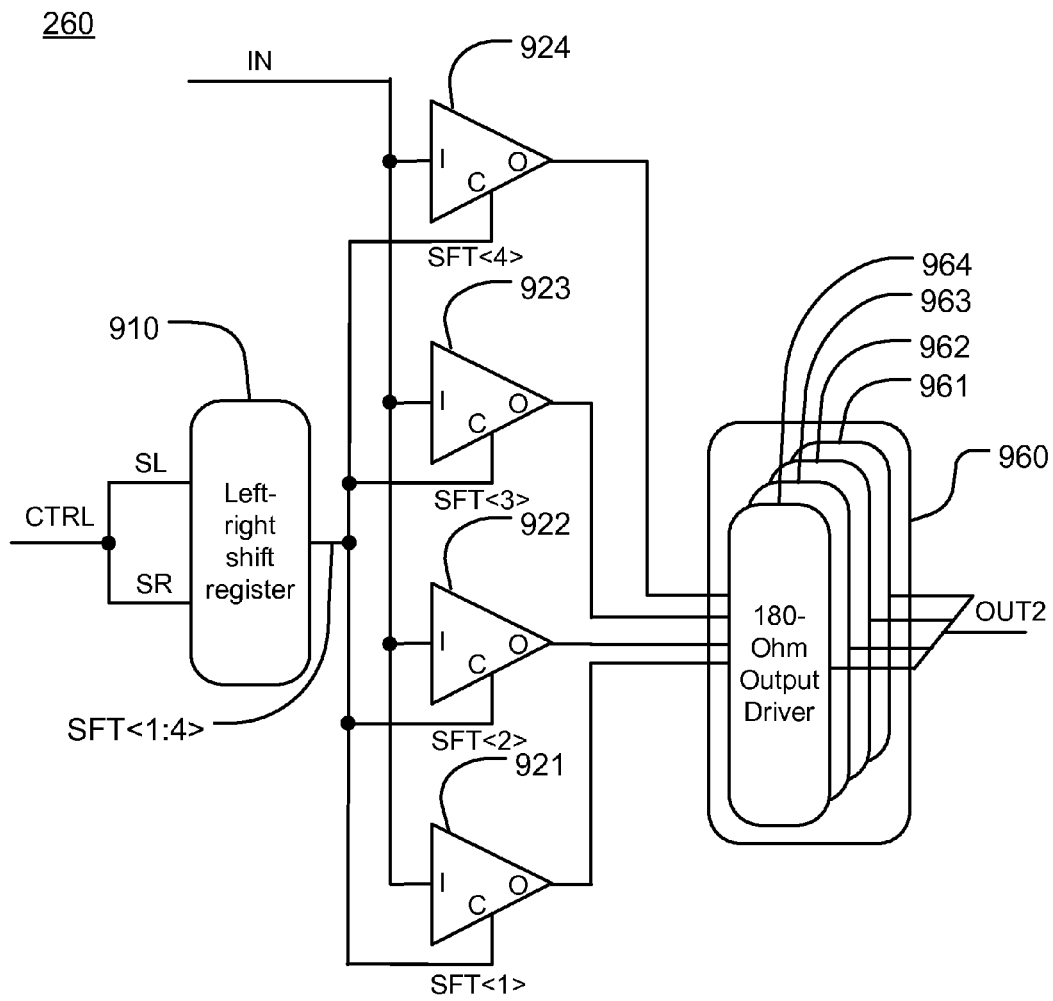
FIG. 9 illustrates an example circuit that controls a strength-adjustable output buffer.

FIG. 9 illustrates an example circuit that controls a strength-adjustable output buffer. In one implementation, the output buffer 260 includes a plurality of parallel output drivers 960, such as output drivers 961, 962, 963, and 964, and the control signals CTRL enable and disable selected output drivers in the plurality of parallel output drivers 960 to adjust the driving strength of the output buffer 260.

The control signals CTRL include a shift-left signal SL and a shift-right signal SR. The shift-left signal SL and the shift-right signal SR are coupled to a multi-bit left-right shift register 910. For convenience of description, a four-bit width is used for the example circuit in FIG. 9. However, other bit widths, such as 8, 16, 32, 64, etc, can also be implemented. As an example, the left-right shift register 910 has a four-bit wide output terminal coupled to a four-bit wide enable signal SFT<1:4>. Four tri-state buffers are coupled to the multi-bit left-right shift register 910, and the input signal IN. The tri-state buffers may be inverting, or non-inverting buffers. Each of the tri-state buffer has a data input coupled to the input signal IN, a control input coupled to a corresponding enable signal, and an output terminal. When a tri-state buffer is turned on by a corresponding bit in the enable signal SFT<1:4> at its control input, the tri-state buffer passes the input signal IN to its output terminal. For instance, when tri-state buffer 923 is turned on by the corresponding bit SFT<3> at its control input, the tri-state buffer 923 passes the input signal IN to its output terminal.

As an example, the initial state of the four-bit wide signal SFT<1:4> is "1100", where "1" indicates "ON", and "0" indicates "OFF" for turning on or off corresponding output drivers in the output buffer 260. In an alternative implementation, "1" may indicate "OFF", and "0" may indicate "ON". With the initial state of "1100", two output drivers are turned on and two output drivers are turned off in the output buffer 260. The total resistance of the output buffer 260 is thus 90-Ohm for two 180-Ohm output drivers.

When the logic 330 detects the need to increase the output driving strength, the logic 330 generates a pulse on the signal SR. In response, the state of the four-bit wide signal SFT<1:4> becomes "1110", and three output drivers are turned on and one output driver is turned off in the output buffer 260. The total resistance of the output buffer 260 is thus 60-Ohm for three 180-Ohm output drivers. Consequently, the output driving strength is increased due to the decreased total resistance.

When the logic 330 detects the need to decrease the output driving strength, the logic 330 generates a pulse on the signal SL. In response, if the initial state of the four-bit wide signal SFT<1:4> is "1100", the state of the four-bit wide signal SFT<1:4> becomes "1000", and one output driver is turned on and three output drivers are turned off in the output buffer 260. The total resistance of the output buffer 260 is thus 180-Ohm for one 180-Ohm output driver. Consequently, the output driving strength is decreased due to the increased total resistance.

The four-bit wide signal SFT<1:4> can be changed to adjust the output driving strength in the output buffer 260 when the output buffer 260 is not in an operation mode or not driving a signal to avoid switching noise in the output buffers. In one implementation, the four-bit wide signal SFT<1:4> can be changed when data lines are off, such as during a strength-adjusting mode, instead of during an operation mode of an integrated circuit. In an operation mode, an output buffer is enabled only when it is necessary, and the signal SFT<1:4> is not allowed to change during transmitting of a signal. Before the output buffer is enabled, the integrated circuit needs to receive a command or commands in a command period. Some commands may also need an address or addresses to specify which output buffers to enable. In a second implementation, during the command period, the signal SFT<1:4> is allowed to change to cause self-calibration of output buffer driving strength. In a third implementation, when the integrated circuit is de-selected or not selected, the signal SFT<1:4> may also be allowed to change.

Figure 10:
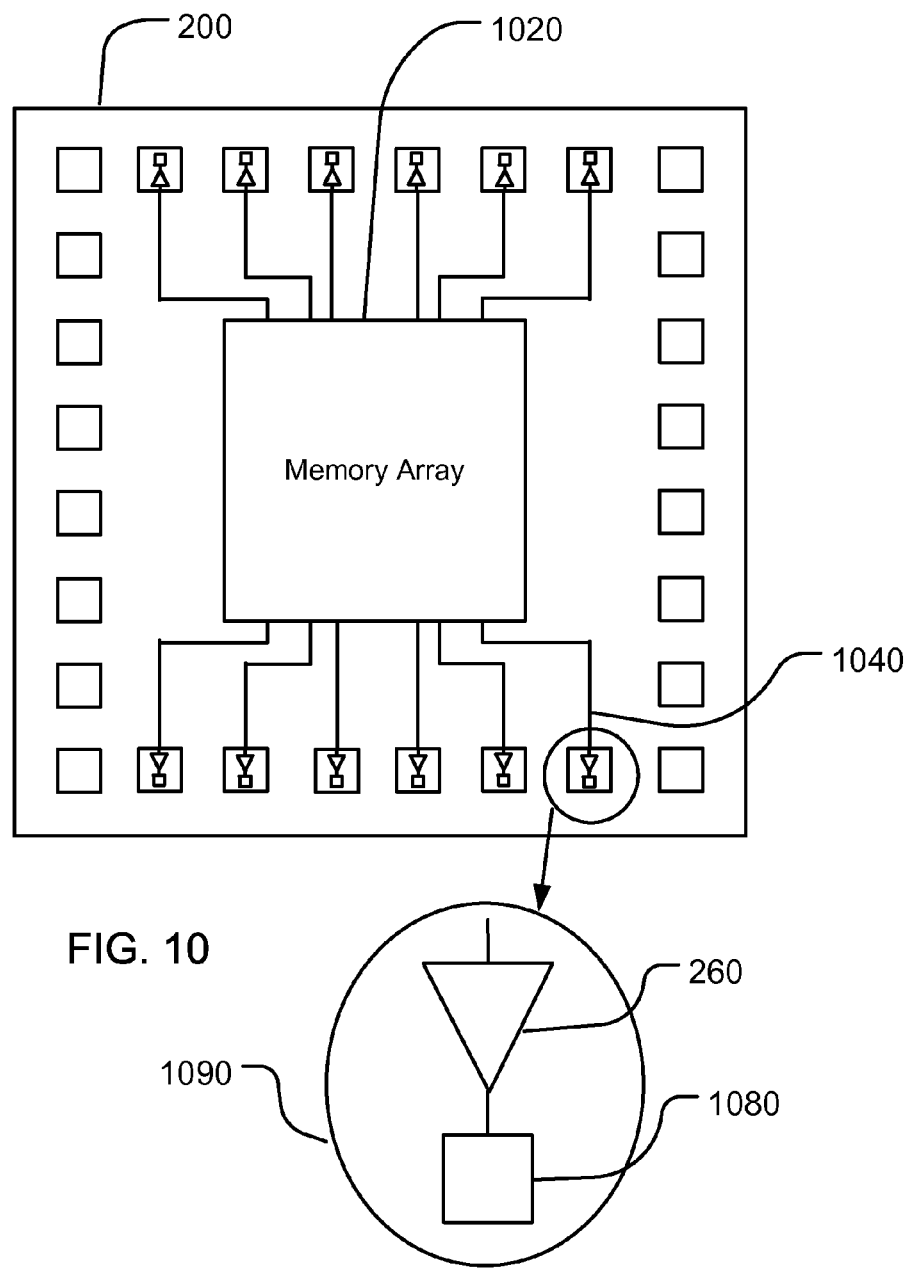
FIG. 10 illustrates a chip diagram of the example integrated circuit.

FIG. 10 illustrates a chip diagram of the example integrated circuit 200. The integrated circuit 200 includes wiring terminals configured for connection to circuitry off of the integrated circuit 200, and wherein the output of the output buffer is connected to the wiring terminal. Wiring terminals can comprise pads for wire bonding to an IC package, "bumps" for flip chip bonding, through silicon via contacts for stacked ICs and the other terminals configured for connection to off-chip communications of the outputs of the output buffers. The integrated circuit 200 in this example, includes a memory array 1020 coupled to output buffers 260 via wiring 1040. In other examples, the integrated circuit may include processors, logic, analog circuits and so on, alone or in combination with other IC components. Circle 1090 illustrates that the output of an output buffer 260 is connected to a wiring terminal 1080.

The integrated circuit 200 includes a plurality of output buffers including the output buffer 260. The output buffers have driving strengths adjustable in response to the control signals CTRL. The control signals CTRL are generated by control circuits 300 to control the plurality of output buffers. The control signals CTRL generated by one control circuit 300 may be applied to the set of control inputs of more than one of the output buffers in the plurality of output buffers. As shown in FIG. 2A, one control circuit 300 is coupled to one output buffer 260. In general, one control circuit 300 can be coupled to one or many output buffers 260. Further, the integrated circuit 200 can include multiple control circuits, each coupled to one or many output buffers. The number of output buffers coupled to a control circuit may be different from the number of output buffers coupled to another control circuit.

Figure 11:
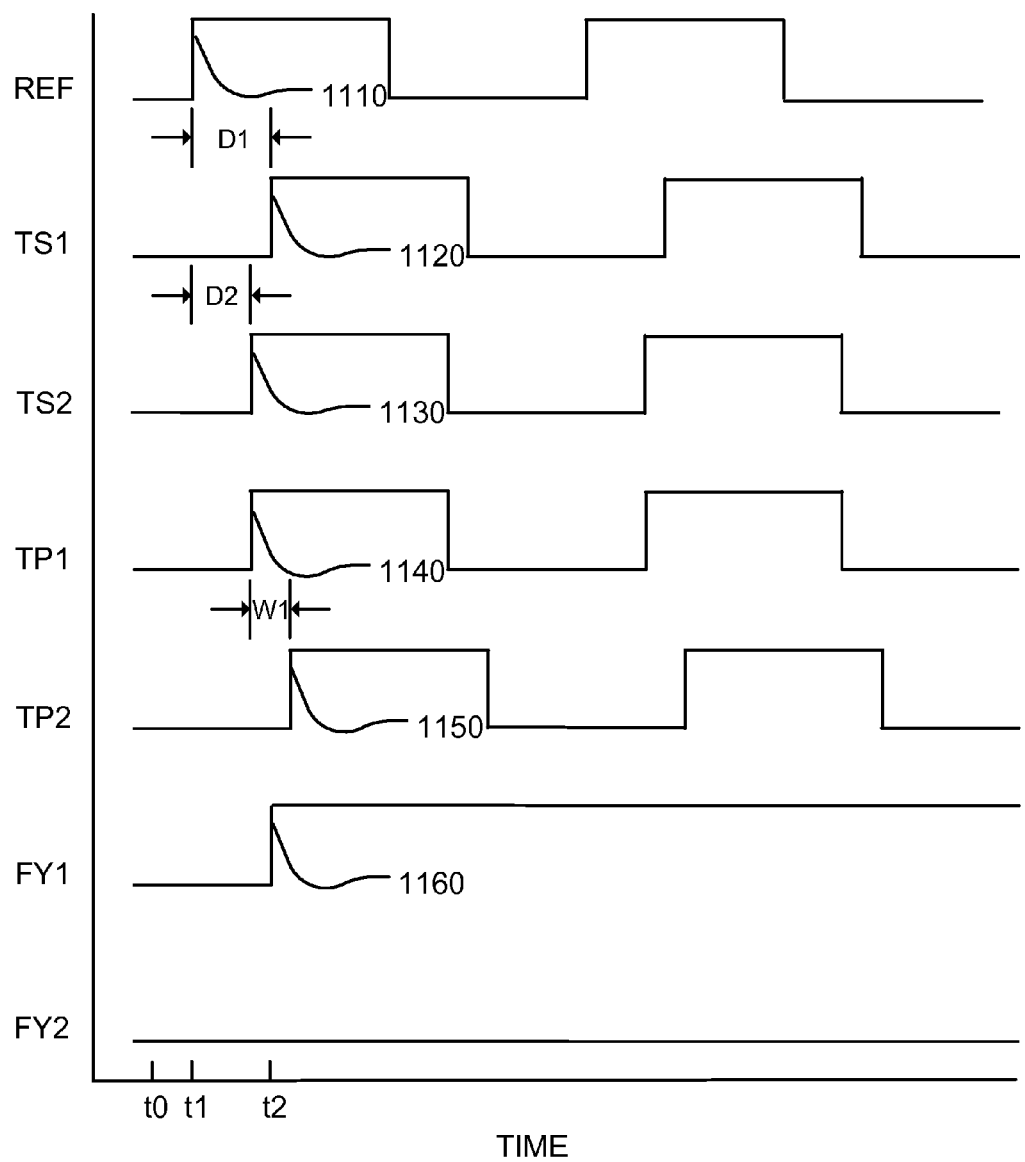
FIGS. 11-13 illustrate example waveforms associated with a method for controlling an output buffer.
Figure 12:
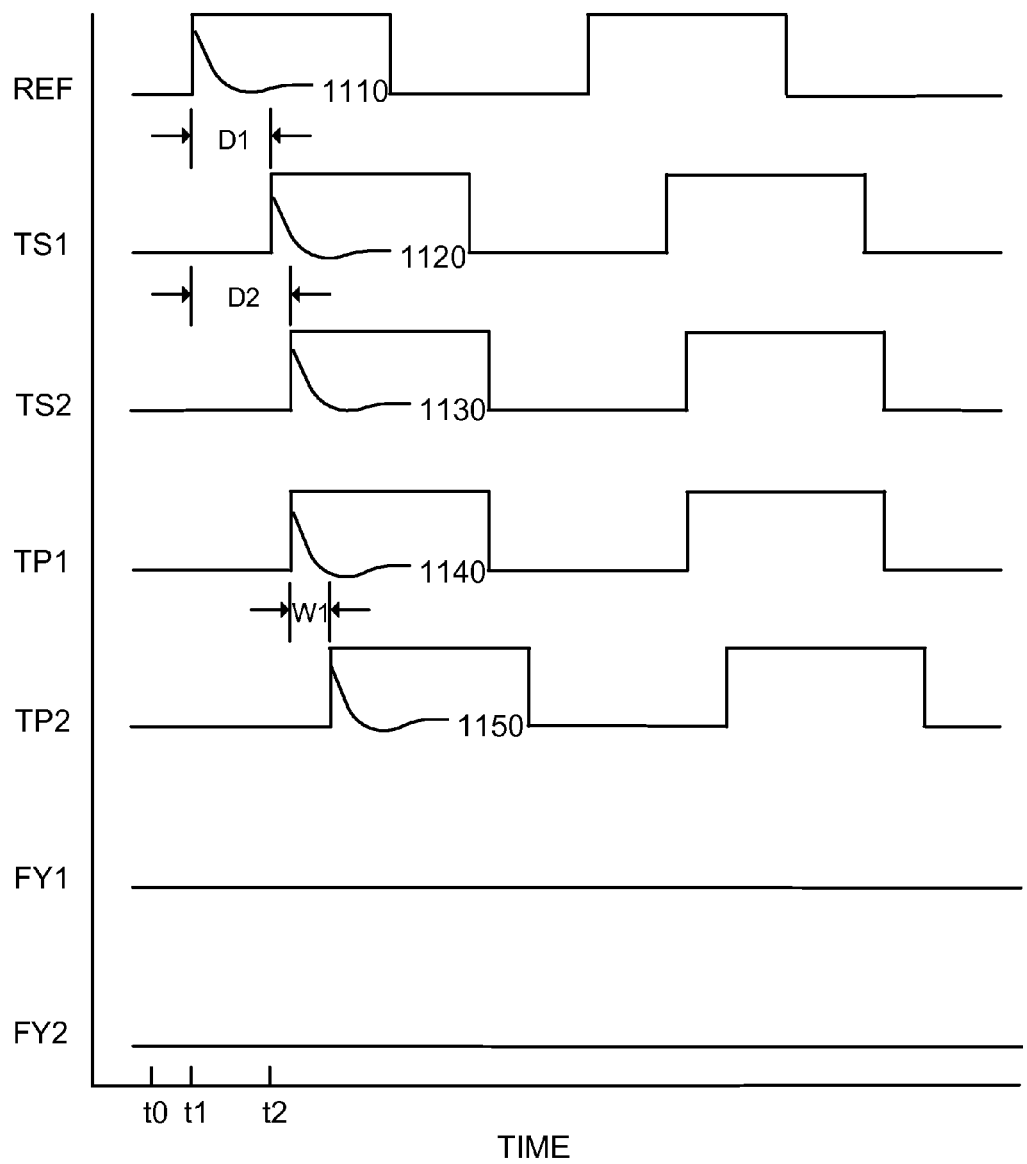
Figure 13:
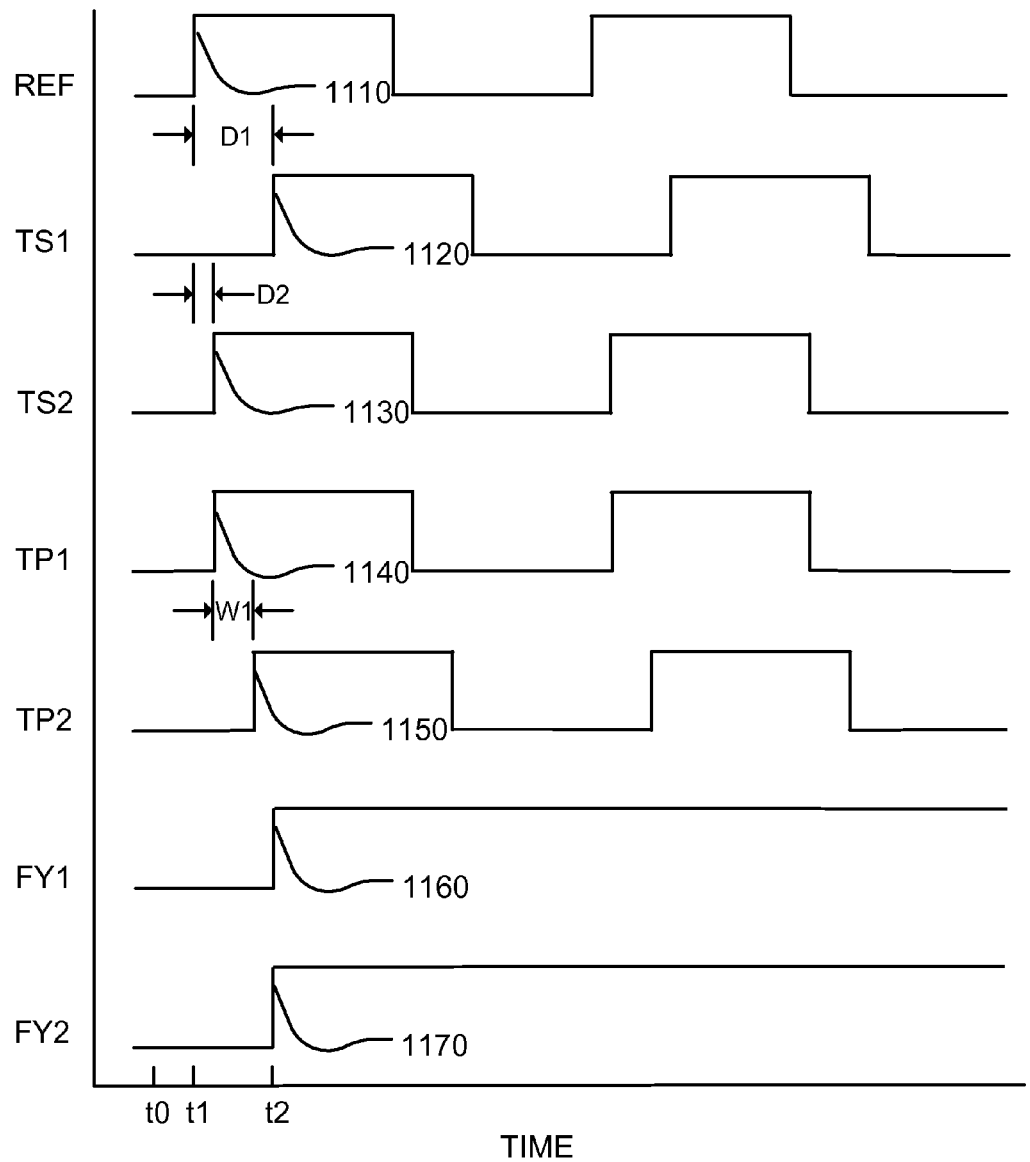

FIGS. 11-13 illustrate a method for controlling an output buffer, where the output buffer has an output buffer delay. The method includes generating a first timing signal TS1 with a reference delay D1, and generating a second timing signal TS2 with an emulation delay D2 that correlates with the output buffer delay. The method also include adjusting the output driving strength of the output buffer in response to the first timing signal TS1 and second timing signal TS2.

Waveforms shown in FIGS. 11-13 are associated with the control circuit 300 shown in FIG. 6, and the decoding operation shown in the truth table in FIG. 7. For convenience of description, signal transitions occur at rising edges in FIGS. 11-13. To those with ordinary skill in the art, the present technology can be implemented with falling edges.

Thus methods disclosed include using a reference delay circuit 400 which responds to a reference signal REF to generate the first timing signal TS1, and wherein the reference delay circuit 400 is substantially insensitive to process-voltage-temperature (PVT) conditions, or to at least one of the process, voltage and temperature conditions. The methods also can include using a delay emulation circuit 310 which responds to the reference signal REF to generate the second timing signal TS2, and wherein the emulation delay D2 correlates with changes in the output buffer delay resulting from process-voltage-temperature (PVT) conditions, or from at least one of the process, voltage and temperature conditions.

The methods can further include generating control signals CTRL in response to the first timing signal TS1 and second timing signal TS2, and using the control signals CTRL to adjust the output driving strength of the output buffer. The control signals CTRL have a first value if the first timing signal TS1 occurs within a timing window W1 between a first delay threshold and a second delay threshold relative to the second timing signal TS2. The control signals CTRL have a second value if the first timing signal TS1 is earlier than the second timing signal TS2 by more than the first delay threshold. The control signals CTRL have a third value if the first timing signal TS1 is later than the second timing signal TS2 by more than the second delay threshold.

The methods can include using a delay line 320 coupled to one of the first and second timing signals. The delay line 320 has a first tap TP1 corresponding to the first delay threshold, and a second tap TP2 corresponding to the second delay threshold. The methods can include generating the control signals CTRL using the first tap TP1 and second tap TP2 of the delay line 320. The timing window W1 is between the first delay threshold corresponding to the first tap TP1 and the second delay threshold corresponding to the second tap TP2.

The methods can include clocking a first storage circuit 615 using the first timing signal TS1, with a data input of the first storage circuit 615 receiving the first tap TP1 of the delay line, clocking a second storage circuit 625 using the first timing signal TS1, with a data input of the second storage circuit 625 receiving the second tap TP2 of the delay line, and using outputs of the first storage circuit 615 and second storage circuit 625 to produce the control signals CTRL.

In FIGS. 11-13, at time t0, signals in the waveforms of FIG. 11 are at a logic low level. At time t1, the reference signal REF transitions from a logic low level to a logic high level as indicated by a rising edge 1110. At time t2, in response to the rising edge 1110, the first timing signal TS1 transitions from a logic low level to a logic high level as indicated by a rising edge 1120, after the reference delay D1 through the reference delay circuit 400. Also in response to the rising edge 1110, the second timing signal TS2 transitions from a logic low level to a logic high level as indicated by a rising edge 1130, after the emulation delay D2 through the reference delay circuit 400. In response to the rising edge 1130 of the second timing signal TS2, the first tap TP1 and second tap TP2 transition from a logic low level to a logic high level as indicated by a rising edge 1140 and a rising edge 1150, respectively.

At the rising edge 1120 of the first timing signal TS1, the first storage circuit 615 and second storage circuit 625 clock in the first tap TP1 and the second tap TP2, respectively. Logic levels of the first tap TP1 and the second tap TP2 as received at data inputs D are provided to outputs FY1 and FY2 of the first storage circuit 615 and second storage circuit 625, respectively.

As shown in FIG. 11, the rising edge 1120 of the first timing signal TS1 occurs within a timing window W1 between a first delay threshold corresponding to the rising edge 1140 of the first tap TP1 and a second delay threshold corresponding to the rising edge 1150 of the second tap TP2. Thus, the first tap TP1 is at logic high and the second tap TP2 is at logic low at time t2. Consequently, the FY1 signal at the output of the first storage circuit 615 transitions to logic high after a rising edge 1160 at time t2, while the FY2 signal at the output of the second storage circuit 625 remains at logic low.

In one example as shown in the truth table in FIG. 7, when the FY1 signal is at logic high and the FY2 signal is at logic low, the driving strength of an output buffer does not need to be increased or decreased. Accordingly, the method may generate the control signals having the first value to indicate there is no need to increase or decrease the output driving strength of an output buffer. For instance, a shift-right signal SR and a shift-left signal SL may be included in the control signals, as described in connection with FIG. 9. The first value may be represented as the absence of a pulse on the shift-right signal SR and the absence of a pulse on the shift-left signal SL.

As shown in FIG. 12, the first timing signal TS1 is earlier than the second timing signal TS2 by more than the first delay threshold corresponding to the rising edge 1140 of the first tap TP1. Thus, the first tap TP1 is at logic low and the second tap TP2 is at logic low at time t2. Consequently, the FY1 signal at the output of the first storage circuit 615 and the FY2 signal at the output of the second storage circuit 625 remains at logic low at time t2.

In one example as shown in the truth table in FIG. 7, when both the FY1 signal and the FY2 signal are at logic low, the driving strength of an output buffer needs to be increased. Accordingly, the method may generate the control signals having the second value to indicate there is need to increase the output driving strength of an output buffer. For instance, the second value may be represented as a pulse on the shift-right signal SR and the absence of a pulse on the shift-left signal SL.

As shown in FIG. 13, the first timing signal TS1 is later than the second timing signal TS2 by more than the second delay threshold corresponding to the rising edge 1150 of the second tap TP2. Thus, the first tap TP1 is at logic high and the second tap TP2 is at logic high at time t2. Consequently, the FY1 signal at the output of the first storage circuit 615 and the FY2 signal at the output of the second storage circuit 625 both transition to logic high at time t2, at rising edge 1160 and rising edge 1170, respectively.

In one example as shown in the truth table in FIG. 7, when both the FY1 signal and the FY2 signal are at logic high, the driving strength of an output buffer needs to be decreased. Accordingly, the method may generate the control signals having the third value to indicate there is need to decrease the output driving strength of an output buffer. For instance, the third value may be represented as a pulse on the shift-right signal SR and a pulse on the shift-left signal SL.

The methods can include determining a timing window from a plurality of timing windows in which the first timing signal occurs relative to the second timing signal, and generating the control signals in response to the determined timing window. For instance, a first timing window may be defined by the delay across the second buffer circuit 820 in FIG. 8, while a second timing window may be defined by the combined delays across the first buffer circuit 810, the second buffer circuit 820, and the third buffer circuit 830 combine in FIG. 8. The methods may generate the control signals in response to the first timing window, or to the second timing window, or both.

The methods can include using a delay line coupled to one of the first and second timing signals, and having a plurality of taps corresponding to the plurality of timing windows, and generating the control signals using the plurality of taps. For instance, the delay line 880 is coupled to the second timing signal TS2, and has a plurality of taps such as TP1, TP2, TP3 and TP4, as illustrated in FIG. 8. Delay between TP1 and TP2 corresponds to the first timing window, while delay between TP3 and TP4 corresponds to the second timing window.

The methods, wherein the output buffer includes a plurality of parallel output drivers, can use the control signals to enable and disable selected output drivers to adjust the driving strength of the output buffer. As illustrated in FIG. 9, the output buffer 260 includes a plurality of parallel output drivers 960, such as output drivers 961, 962, 963, and 964. The methods can use the control signals CTRL, including the shift-left signal SL and the shift-right signal SR, to enable and disable selected output drivers to adjust the driving strength of the output buffer 260.

The methods, where the output buffer is on an integrated circuit including a wiring terminal configured for connection to circuitry off of the integrated circuit, can supply the output of the output buffer to the wiring terminal. As illustrated in FIG. 10, the integrated circuit 200 includes a memory array 1020 coupled to a plurality of output buffers such as the output buffer 260. The output buffer 260 is on the integrated circuit 200 including a wiring terminal 1080 configured for connection to circuitry off of the integrated circuit 200. The method can supply the output of the output buffer 260 to the wiring terminal 1080.

The methods can include controlling a plurality of output buffers including the output buffer, using the control signals generated by one control circuit 300 to adjust the output driving strength of more than one of the output buffers in the plurality of output buffers. The control signals are generated by control circuits to control the plurality of output buffers. There may be a one-to-one, or one-to-many correspondence between control circuits and output buffers. As shown in FIG. 2A, one control circuit 300 is coupled to one output buffer 260. In general, one control circuit 300 can be coupled to one or many output buffers such as the output buffer 260. Further, an integrated circuit can include multiple control circuits, each coupled to one or many output buffers. The number of output buffers coupled to a control circuit may be different from the number of output buffers coupled to another control circuit.

While the present technology is disclosed by reference to the preferred implementations and examples detailed above, it is to be understood that these examples are intended in an illustrative rather than in a limiting sense. It is contemplated that modifications and combinations will readily occur to those skilled in the art, which modifications and combinations will be within the spirit of the technology and the scope of the following claims.

What is claimed is:

1. An integrated circuit comprising:
an output buffer having a signal input, a signal output, and a set of control inputs, the output buffer having an output buffer delay, and a driving strength adjustable in response to control signals applied to the set of control inputs; and
a control circuit connected to the set of control inputs of the output buffer, the control circuit using first and second timing signals to generate the control signals, and including a reference delay circuit that generates the first timing signal with a reference delay substantially insensitive to at least one of process, voltage and temperature (PVT) conditions, and a delay emulation circuit that generates the second timing signal with an emulation delay that changes with variations in the output buffer delay resulting from said at least one of process, voltage and temperature (PVT) conditions.

2. The integrated circuit of claim 1, wherein
the reference delay circuit responds to a reference signal to generate the first timing signal with the reference delay; and
the delay emulation circuit responds to the reference signal on its input to generate the second timing signal on its output with the emulation delay.

3. The integrated circuit of claim 1, wherein the control signals have a first value if the first timing signal occurs within a timing window between a first delay threshold and a second delay threshold relative to the second timing signal, a second value if the first timing signal is earlier than the second timing signal by more than the first delay threshold, and a third value if the first timing signal is later than the second timing signal by more than the second delay threshold.

4. The integrated circuit of claim 3, wherein the control circuit includes
  a delay line, having an input coupled to the delay emulation circuit, and having a first tap corresponding to the first delay threshold, and a second tap corresponding to the second delay threshold, and
  logic coupled to the first and second taps on the delay line, and to the reference delay circuit, which generates the control signals.

5. The integrated circuit of claim 4, wherein the logic comprises:
  a first storage circuit having a clock input terminal electrically coupled to the reference delay circuit to receive the first timing signal, a data input terminal electrically coupled to the first tap of the delay line, and having an output terminal;
  a second storage circuit having a clock input terminal electrically coupled to the reference delay circuit to receive the first timing signal, a data input terminal electrically coupled to the second tap of the delay line, and having an output terminal; and
  a decoder coupled to the outputs of the first and second storage circuits to produce the control signals.

6. The integrated circuit of claim 1, wherein the control circuit includes circuits that indicate a timing window from a plurality of timing windows in which the first timing signal occurs relative to the second timing signal, and logic which generates the control signals in response to the indicated timing window.

7. The integrated circuit of claim 6, wherein the control circuit includes
  a delay line, having an input coupled to the delay emulation circuit, and having a plurality of taps corresponding to the plurality of timing windows, and
  logic coupled to the plurality of taps on the delay line, and to the reference delay circuit, which generates the control signals.

8. The integrated circuit of claim 1, wherein the output buffer comprises a plurality of parallel output drivers, and the control signals enable and disable selected output drivers to adjust the driving strength of the output buffer.

9. The integrated circuit of claim 1, including a wiring terminal configured for connection to circuitry off of the integrated circuit, and wherein the output of the output buffer is connected to the wiring terminal.

10. The integrated circuit of claim 1, including a plurality of output buffers including said output buffer, having driving strengths adjustable in response to said control signals, wherein said control signals are applied to the set of control inputs of more than one of the output buffers in the plurality of output buffers.

11. A method for controlling an output buffer, where the output buffer has an output buffer delay, comprising:
  generating a first timing signal with a reference delay substantially insensitive to at least one of process, voltage and temperature (PVT) conditions;
  generating a second timing signal with an emulation delay that changes with variations in the output buffer delay resulting from said at least one of process, voltage and temperature (PVT) conditions; and
  adjusting the output driving strength of the output buffer in response to the first and second timing signals.

12. The method of claim 11, including using a reference delay circuit which responds to a reference signal to generate the first timing signal; and
  using a delay emulation circuit which responds to the reference signal to generate the second timing signal.

13. The method of claim 11, further comprising:
  generating control signals in response to the first and second timing signals, and using the control signals to adjust the output driving strength of the output buffer, wherein the control signals have
  a first value if the first timing signal occurs within a timing window between a first delay threshold and a second delay threshold relative to the second timing signal,
  a second value if the first timing signal is earlier than the second timing signal by more than the first delay threshold, and
  a third value if the first timing signal is later than the second timing signal by more than the second delay threshold.

14. The method of claim 13, including
  using a delay line coupled to one of the first and second timing signals, the delay line having a first tap corresponding to the first delay threshold, and a second tap corresponding to the second delay threshold, and generating the control signals using the first and second taps of the delay line.

15. The method of claim 14, including:
  clocking a first storage circuit using the first timing signal, with a data input of the first storage circuit receiving the first tap of the delay line;
  clocking a second storage circuit using the first timing signal, with a data input of the second storage circuit receiving the second tap of the delay line; and
  using outputs of the first and second storage circuits to produce the control signals.

16. The method of claim 11, including
  determining a timing window from a plurality of timing windows in which the first timing signal occurs relative to the second timing signal, and generating the control signals in response to the determined timing window.

17. The method of claim 16, including
  using a delay line coupled to one of the first and second timing signals, and having a plurality of taps corresponding to the plurality of timing windows, and
  generating the control signals using the plurality of taps.

18. The method of claim 11, wherein the output buffer comprises a plurality of parallel output drivers, and using the control signals to enable and disable selected output drivers to adjust the driving strength of the output buffer.

19. The method of claim 11, wherein the output buffer is on an integrated circuit including a wiring terminal configured for connection to circuitry off of the integrated circuit, and supplying the output of the output buffer to the wiring terminal.

20. The method of claim 13, including controlling a plurality of output buffers including said output buffer, using said control signals to adjust the output driving strength of more than one of the output buffers in the plurality of output buffers.

* * * * *